United States Patent [19]

Turnbull

[11] Patent Number: 5,099,120
[45] Date of Patent: Mar. 24, 1992

[54] THERMAL-RADIATION DETECTORS, DETECTION SYSTEMS AND THEIR MANUFACTURE

[75] Inventor: Andrew A. Turnbull, Reigate, England

[73] Assignee: U.S. Philips Corporation, New York, N.Y.

[21] Appl. No.: 540,080

[22] Filed: Jun. 19, 1990

[30] Foreign Application Priority Data

Jun. 20, 1989 [GB] United Kingdom ............... 8914109
Apr. 6, 1990 [GB] United Kingdom ............... 9007874

[51] Int. Cl.$^5$ .............................................. G01J 5/20
[52] U.S. Cl. ................................. 250/338.2; 250/332; 250/338.3; 250/349
[58] Field of Search ............... 250/338.2, 338.3, 332, 250/349, 352

[56] References Cited

U.S. PATENT DOCUMENTS 4,425,502 1/1984 Hall et al. ..................... 250/338.3
4,894,544 1/1990 Turnbull ........................ 250/349

FOREIGN PATENT DOCUMENTS

182523 10/1983 Japan .............................. 250/338.3
2206997 1/1989 United Kingdom .

Primary Examiner—Carolyn E. Fields
Attorney, Agent, or Firm—William L. Botjer

[57] ABSTRACT

In a thermal-radiation detection system, the thermal radiation (3) incident on a group of pyroelectric and/or ferroelectric infrared detector elements (20) is modulated at a frequency (f). The detector elements (20) are mounted on flexible platform areas of an insulating substrate (10) which may be of an elastic material such as a silicone rubber in, for example, an apertured or recessed mount (18,19). The grooves (15,16) forming the platform areas have a sufficient depth d and width w that the distance (2d+w) is at least as large as the thermal diffusion distance at the modulation frequency (f) so as to reduce thermal cross-talk between the detector elements (20). The elasticity and vibration absorption properties of an elastic substrate (10) and the flexibility and path length increased by the presence of the grooves (15,16) can provide a low microphony mounting arrangement with acoustic decoupling between detector elements (20). Preferably the groove depth d is at least as large as the thermal diffusion distance so as to reduce thermal losses from each detector element (20) and increase the acoustic path length and flexibility of the mounting. The substrate (10) may be molded with the grooves in its face (11), or the grooves may be cut with a saw.

14 Claims, 3 Drawing Sheets

THERMAL-RADIATION DETECTORS, DETECTION SYSTEMS AND THEIR MANUFACTURE

BACKGROUND OF THE INVENTION

This invention relates to thermal-radiation detectors comprising a group of infrared detector elements of ferroelectric and/or pyroelectric material, and to detection systems comprising such detectors and modulation means (for example, a chopper) in front of the detector elements for periodically modulating the transmission of the thermal-radiation to the detector elements. Such a detection system may be used in, for example, an infrared camera or other infrared imaging equipment. The invention also relates to a method of manufacturing such detectors.

Thermal-radiation detection systems are known comprising a group of the infrared detector elements with the modulation means mounted in front of the detector elements. The temperatures of the detector elements change in response to the incident thermal-radiation. Modulating the transmission of this radiation to the detector elements is particularly important for pyroelectric elements, because the pyroelectric charge is produced only while the temperature of the element is changing. This is normally achieved by chopping the incident radiation at a uniform frequency, the element being exposed to radiation at a reference temperature (from the chopper blade) while transmission of the radiation from the scene being viewed is interrupted by the chopper blade. Thus, the modulation determines a transmission frequency for the incidence of the thermal-radiation on the detector elements.

In general, pyroelectric and ferroelectric materials are also piezoelectric. Hence the detector elements also produce electrical output if subjected to varying stress (for example by vibration or shock). This phenomenon, termed microphony, constitutes undesired background noise which interferes with the detection of the thermal radiation. In order to reduce microphony, it is known to mount the detector elements on a first face of a flexible substrate of thermally insulating polymer material (such as a very thin polyimide membrane) having first and second opposite faces. The flexibility of this known substrate derives from the thinness of the membrane, because polyimide in itself is not a very flexible material. Such a mounting arrangement is described in, for example published European patent application EP-A-0 041 297, published UK patent application GB-A-2 100 058 and the paper entitled "The application of heat-collector fins to reticulated pyroelectric arrays" by A. A. Turnbull, presented in Cannes, France in November 1985 and published in the Proceedings of SPIE (Society of Photo-Optical Instrumentation Engineers, USA) Vol 588, Recent developments in materials and detectors for the infrared (1985), pages 38 to 43. The whole contents of these two patent applications and the said 1985 SPIE paper are hereby incorporated as reference material in the present specification.

It is known from said 1985 SPIE paper to manufacture such a device by mounting a body of the pyroelectric material (for example ceramic PLMZT, lead lanthanum manganese zirconium titanate) on a substrate, sawing grooves through the thickness of the body to reticulate the material for the individual detector elements, transferring the whole reticulated array in one operation from the substrate to the polyimide membrane which carries the bottom electrode connection pattern, and thereafter providing a top electrode connection (for example carried by a second polyimide membrane which preferably also carries a heat-collector fin). In this manner a high performance pyroelectric detector element array is formed with good thermal isolation and low microphony and in a comparatively inexpensive manner.

SUMMARY OF THE INVENTION

In one form, the present invention provides a grooved thicker flexible substrate of elastic material as an alternative flexible mounting arrangement which can provide good acoustic decoupling to the detector elements as a result of its elasticity and dampening of vibrations and increased acoustic path length between detector elements, and which may permit the detector to be manufactured with less manufacturing steps and so can reduce manufacturing costs. Furthermore, although the thermal isolation between membrane-mounted detector elements is good (due to the low thermal conductance along the very thin plastics membrane), the present invention involves a recognition by the present inventor that, by adopting an alternative grooved thicker substrate configuration, even better thermal isolation through the substrate can be achieved while still permitting the detector elements to be closely spaced.

According to a first aspect of the present invention, there is provided a thermal-radiation detector comprising a group of infrared detector elements of ferroelectric and/or pyroelectric material the temperatures of which change in response to incident thermal-radiation, and a flexible substrate of electrically and thermally insulating polymer material having first and second opposite faces on the first of which the detector elements are mounted, characterised in that the substrate comprises elastic material into which grooves extend from the first face of the substrate so as to form a group of flexible platform areas on each of which a respective detector element is mounted.

By using elastic material (for example a silicone rubber or other elastomer) a very flexible mounting with low microphony can be achieved, in spite of the thickness of the substrate. Stress in the detector elements on these flexible platform areas is kept low because of the elasticity and vibration-dampening properties of the substrate. There is a very large difference in Young's modulus between the elastomer and the detector element material, i.e. typically the elastomer has a Young's modulus of less than one millionth of that of the detector element. The stress reduction is enhanced by the presence of the grooves (of depth d and width w) in the elastic material. These grooves increase the flexibility of the mounting and the acoustic path length $(2d+w)$ between detector elements (and hence acoustic decoupling between detector elements). Indeed, the platform areas may be so flexible in some cases that in the absence of restraint their locations might wobble slightly relative to each other. However, in this extreme case, the detector elements mounted on these flexible platform areas can be restrained in wobbling from their locations relative to each other by electrode connections secured to the front face of the detector elements. If the substrate bends, the presence of the grooves in the elastic material permits more independent movement (or restraint of movement) for each platform area for the detector elements so that stresses which may occur in the detector element upon bending the substrate are kept smaller than would be the case in the absence of the grooves. This is important in reducing microphony for those ferroelectric and/or pyroelectric detector elements which are also piezoelectric.

According to a second aspect of the invention, there is provided a thermal-radiation detection system comprising a detector in accordance with the first aspect of the invention, and modulation means in front of the detector elements for periodically modulating the transmission of the thermal-radiation to the detector elements thereby determining a transmission frequency for the incidence of the thermal-radiation on the detector elements, which system is characterised in that the grooves in the substrate have a sufficient depth d and width w that the distance $(2d+w)$ is at least as large as the thermal diffusion distance for heat flow in the substrate from the detector elements at the transmission frequency for the incidence of the thermal-radiation on the detector elements.

According to a third aspect of the present invention there is provided a thermal-radiation detection system comprising a group of infrared detector elements of ferroelectric and/or pyroelectric material the temperatures of which change in response to incident thermal-radiation, a substrate of electrically and thermally insulating material having first and second opposite faces on the first of which the detector elements are mounted, and modulation means in front of the detector elements for periodically modulating the transmission of the thermal-radiation to the detector elements thereby determining a transmission frequency for the incidence of the thermal-radiation on the detector elements, characterised in that the first face of the substrate is divided by grooves of width w and depth d into a group of platform areas on each of which a respective detector element is mounted, in that the grooves are sufficiently deep and wide that the distance $(2d+w)$ is at least as large as the thermal diffusion distance for heat flow in the substrate from the detector elements at the transmission frequency for the incidence of the thermal-radiation on the detector elements.

Because the transmission of the thermal-radiation to the detector elements is modulated, there is a thermal diffusion distance (the magnitude of which depends on the transmission frequency) for heat flow in the substrate from the detector elements. Parts of the substrate beyond this distance do not experience temperature variations due to the variations in temperature of the detector elements which correspond to the variations in incident thermal radiation. By making the distance $(2d+w)$ through the substrate between neighbouring detector elements at least as large as the thermal diffusion distance, thermal cross-talk through the substrate is reduced as compared with thermal cross-talk along a membrane. The responsivity of the detector elements (and the acoustic decoupling) is improved if the depth d of the grooves in the substrate is large, for example at least as large as approximately said thermal diffusion distance at said transmission frequency.

Furthermore, since the invention permits the use of thick substrates (instead of thin membranes), the grooves may be conveniently formed by sawing, and this may be effected as a continuation of saw cuts which may be used to reticulate the detector elements in situ on the insulating substrate of the detector (instead of needing to reticulate on another substrate and then to transfer). However, the grooves in the substrate may be formed in other ways, for example by being moulded in the first face of the elastic material.

Thus, according to a fourth aspect of the invention, there is provided a method of manufacturing particular detectors in accordance with the first aspect in which the grooves in the insulating substrate and/or the separation of the detector elements and/or the separation of conductor tracks on the substrate are formed by saw cuts on the insulating substrate.

The substrate of elastic material may be supported on top of a rigid base, for example a glass plate or a header or plinth of an envelope of the detector. The top face of this rigid mount may be substantially flat. However, a channel or other surface-recess may be present at the top face of the rigid mount so as to accommodate a large thickness of the elastic material at least below the detector elements. In this case, the elastic substrate may be entirely located within the surface recess, or it may also extend laterally from the recess onto the surrounding upper surface of the mount. In highly integrated detector constructions, the rigid base may be for example a circuit board or even a semiconductor signal-processing circuit.

However, the substrate may be suspended in at least one aperture of a rigid mount; in this case, at least most of the area of the second face of the elastic material (opposite that on which the detector elements are mounted) can be free of contact with any rigid support, and a high flexibility of the substrate can be obtained. Furthermore, this second face of the elastic material may be recessed in the aperture(s) so as to increase the flexibility of the substrate.

The elastic material may also extend onto an upper surface of the rigid mount around the surface-recess or aperture(s); this arrangement can be adopted to provide more freedom in the longitudinal extent of, for example, saw cuts used to form the grooves in the substrate when it is desired not to cut into the recessed or apertured rigid mount. However the rigid mount may be of a material (for example a glass) which can easily be cut with a saw used to form the grooves in the elastic substrate, and the saw cuts may be continued into the rigid mount.

All the platform areas may be entirely isolated laterally from each other by the grooves. However, the elastic substrate may comprise a peripheral part which is integral with neighbouring platform areas for detector elements of the group; in this case, thermal cross-talk between these detector elements can be reduced by making the length of the grooves from these detector elements to the peripheral part of the substrate to be at least as large as approximately said thermal diffusion distance at said transmission frequency.

BRIEF DESCRIPTION OF THE DRAWINGS

These and other features in accordance with the invention are illustrated specifically in embodiments of the invention now to be described, by way of example, with reference to the accompanying diagrammatic drawings. In these drawings.

It should be noted that the accompanying drawings are diagrammatic and not drawn to scale. The relative dimensions and proportions of parts of FIGS. 2 to 9 (especially in the direction of thickness) have been shown exaggerated or reduced in size for the sake of clarity and convenience in the drawings. The same reference signs as used in one embodiment are generally used for referring to corresponding or similar parts in other embodiments.

DETAILED DESCRIPTION OF THE PREFERRED EMBODIMENT

The thermal-radiation detection system illustrated in FIGS. 1 to 4 comprises a detector 2 having a group of infrared detector elements 20 (see FIGS. 2 to 4) of ferroelectric and/or pyroelectric material the temperatures of which change in response to incident thermal-radiation 3 from a scene being viewed. The detector 2 comprises a flexible substrate 10 of electrically and thermally insulating polymer material having first and second opposite faces 11 and 12. The detector elements 20 are mounted on the first face 11. The system also comprises modulation means 1 in front of the detector elements 20 for periodically modulating the transmission of the thermal-radiation 3 to the detector elements 20 thereby determining a transmission frequency f for the incidence of the thermal-radiation 3 on the detector elements 20.

In accordance with the present invention, the substrate 10 comprises elastic material into which grooves 15 and 16 extend from the first face 11 of the substrate 10. The grooves 15 and 16 (of width w and depth d) divide the substrate face 11 into a group of flexible platform areas on each of which a respective detector element 20 is mounted. Furthermore, in accordance with the invention, the grooves 15 and 16 are sufficiently deep and wide that the distance $(2d+w)$ is at least as large as the thermal diffusion distance D for heat flow in the elastic substrate 10 from the detector elements at the transmission frequency f for the incidence of the thermal-radiation 3 on the detector elements 20. The elasticity and vibration-dampening properties of the substrate material can provide a low microphony mounting arrangement for the detector elements 20, and the grooves 15 and 16 in this elastic material reduce stress in the detector elements 20 for a given bending of the substrate. The grooves also provide acoustic decoupling between the detector elements 20 by increasing the acoustic path length to $(2d+w)$. Various mount constructions in accordance with the invention are described hereinafter for the elastic substrate 10.

Figure 1:
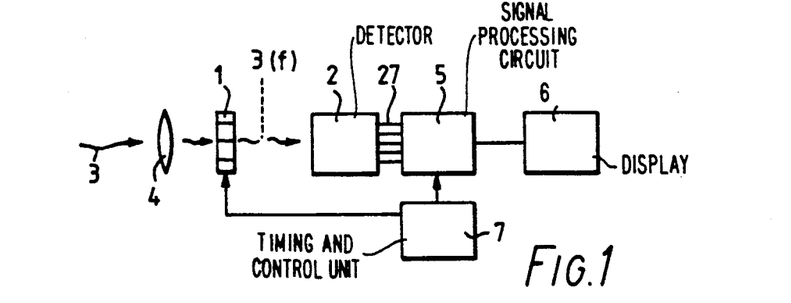
FIG. 1 is a schematic block diagram of a thermal-radiation detection system in accordance with the invention.

Except for the construction of the detector 2, the system of FIG. 1 may comprise known components arranged in known manner, for example to form an infrared camera. Thus, the radiation 3 may be focussed on the detector elements 20 through an infrared optical system 4, normally comprising a lens system and possibly also comprising a scanner at least in the case of a linear array of detector elements 20. The transmission-modulation means 1 may be a mechanical chopper for periodically interrupting the radiation 3, for example at a frequency f of 40 Hz. The detector elements 20 have electrode connections 21 and 22 by which the elements 20 are connected to a signal processing circuit 5. The circuit 5 comprises electronic circuitry for drive and read-out and video processing in order to generate a video signal which may be fed to a display means 6, for example a television monitor. A timing and control unit 7 is coupled to the chopper 1 and connected to the signal processing circuit 5 so as to produce the video output signals of the scene in a desired format for display by the television monitor.

The specific structure of a pyroelectric detector 2 will now be described with reference to FIGS. 2 to 4. In the embodiment illustrated by way of example, two rows of detector elements 20 are formed back to back on the face 11 of the flexible substrate 10. Only thirteen detector elements are shown in each row in FIG. 2, but it should be understood that in a typical thermal-image detector each row may comprise a linear array of many more, for example 64 or 128 detector elements 20. The elements 20 have top and bottom electrode connections 21 and 22 respectively to opposite metallised faces of the pyroelectric material. The thermal radiation is incident at the top of the detector elements 20, which may have a common top connection 21 in the case of these linear arrays. Each detector element 20 has its own separate individual bottom connection 22 which extends below the respective element 20 and away from one side of the element 20 as a conductor track carried on the elastic substrate 10.

Figure 2:
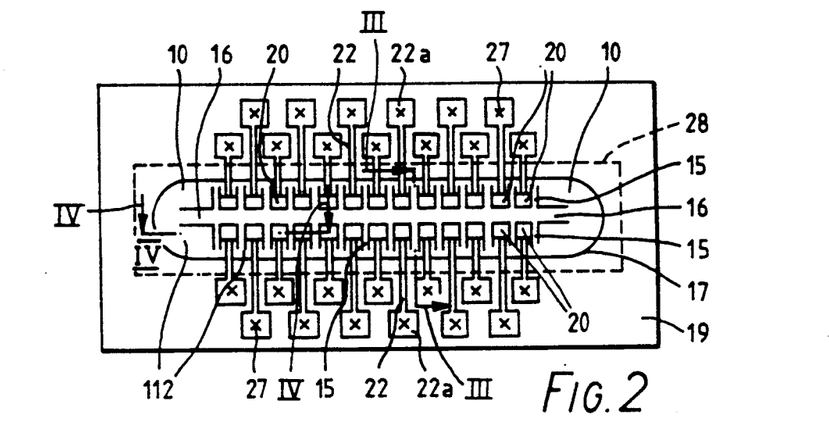
FIG. 2 is a plan view of one specific embodiment of the thermal-radiation detector in the system of FIG. 1.

The elastic substrate 10 is suspended in an aperture 17 of a rigid mount 18,19, in the form illustrated in FIG. 2. For the two back to-back linear arrays 20, the aperture 17 is slot shaped and may be for example about 2 mm wide by about 1 cm long for rows of 64 elements 20 per row. The mount 18,19 may be a preform of, for example, alumina or glass, or it may comprise a glass film 19 on an alumina or other preform 18. The preform 18 may have a thickness of, for example, about 250 micrometers, and the glass may be, for example, about 100 micrometers thick. The elastic material of the flexible substrate 10 is moulded in the aperture 17. A silicone rubber is a convenient elastomer for use as the thick flexible substrate 10.

Figure 6:
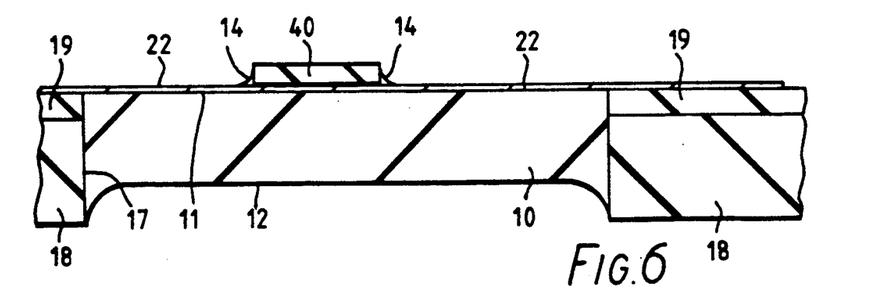
FIG. 6 is a cross-sectional view similar to that of FIG. 3 but at an early stage in the manufacture of the detector structure of FIG. 3.
Figure 7:
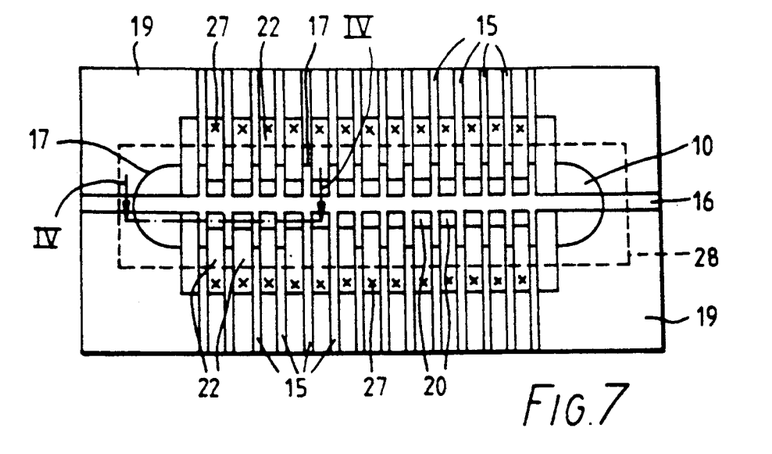
FIG. 7 is a plan view of another specific embodiment of a detector for the system of FIG. 1, illustrated as a modification of FIG. 2, and FIGS. 8 and 9 are cross-sectional views (similar to that of FIG. 3) of a further specific embodiments of a detector in accordance with the invention.

Silicone rubbers have a particularly good combination of mechanical, thermal and electrical properties, and in particular durable elasticity and vibration absorption properties and low thermal conductivity. One example of a suitable material is a silicone rubber available under the Dow Corning trade name "Sylgard"; this is formed by mixing together its two liquid components (silicone rubber and catalyst) and flowing the mixture into the aperture 17. Preferably a primer is first applied to the surfaces of the mount 18,19 which are required to be bonded to the silicone rubber substrate 10. Suitable primers for use with Sylgard are also available from Dow Corning. In order to increase its flexibility the silicone rubber 10 may be so moulded in the aperture 17 that its face 12 (opposite that on which the detector elements 20 are to be mounted) is recessed in the aperture 17 as illustrated in FIGS. 3,4 and 6. The silicone rubber 10 is formed with a smooth and flat upper face 11 (see FIG. 6) and it may also extend onto the upper surface of the rigid mount 18,19 around the aperture 17 (see FIG. 8). By way of a specific illustration, with a mount 18.19 of thickness 350 micrometers, the flexible silicone-rubber substrate 10 may be, for example about 150 micrometers thick in the area of the aperture 17. The elastic substrate 10 may be formed with the grooves 15 and 16 moulded in its upper flat face 11, or the grooves may be formed later.

The electrode connections 22 may be formed in known manner by metallization on the face 11 of the substrate 10, before mounting the pyroelectric body of the detector elements 20. Thus, the connections 22 may comprise, for example, a thin seeding layer of sputtered nickel chromium on which gold may be evaporated to a thickness, for example, between 2 and 20 nm.

The whole of (or at least most) the desired pattern for the connections 22 may be defined by depositing the metallization through a stencil mask on the face 11. In the particular example illustrated in FIG. 2, this metallization pattern 22 has expanded areas below the detector elements 20, expanded areas 22a on the rigid mount 18, and narrow tracks therebetween. The expanded areas 22a form bond pads to which wire connections 27 can be made to connect each detector element 20 to, for example, a gate of a respective field-effect transistor in the signal-processing circuit 5. The wire bonds 27 are designed with 'x' in the plan view of FIG. 2.

The detector element bodies 20 may be formed in situ on the thick elastic substrate 10 using, for example, a saw blade to cut grooves separating the bodies 20 and then continuing to cut into the substrate 10 to form the grooves 15 and 16. This results in the structure illustrated in FIGS. 2 to 5 in which the grooves between the detector elements 20 are in alignment with the grooves 15 and 16 in the substrate 10, and in which the bottom face of each detector element 20 is the same size as that of the flexible platform area on which it is mounted.

The structure is obtained by mounting on the metallized elastic substrate 10 a body 40 from which the elements 20 are to be formed. The body 40 may be of any of a wide variety of ferroelectric and/or pyroelectric materials suitable for forming infrared detector elements. Particular examples are: lead zirconate titanate (for example lanthanum-doped lead zirconate titanate, PLZT, or PLMZT), barium titanate, triglycene sulphate (TGS), barium strontium titanate, lead titanate, potassium tantaloniobate, potassium dihydrogen phosphate and Rochelle salt. Before it is mounted on the substrate 10, the top and bottom faces of the body 40 are metallized to form thin electrodes which will ensure a good electrical contact with the correction layers 21 and 22. This electrode metallization may comprise gold on, for example, a seed layer of nickel chromium. Typical dimensions of an elongate body 40 for two rows each of 64 detector elements 20 are, for example, a width of 300 micrometers, a length of about 7.7 mm and a thickness of between about 10 to 40 micrometers. A thin conductive adhesive layer may be used to attach the metallized bottom face of the body 40 to the conductor pattern 22 on the insulating elastic substrate 10 so as to form an electrode connection to the bottom face. FIG. 6 shows the body 40 mounted on the elastic substrate 10. In order to secure the body 40 firmly to the substrate 10 for the sawing step, an additional coating 14 of silicone rubber or insulating adhesive may be provided along the perimeter of the body 40 as illustrated in FIG. 6.

The grooves 15 and 16 are then formed to divide the body 40 into the group of detector elements 20 and to extend to a depth d in the substrate 10. The groove 16 is cut along the length of the body 40, whereas parallel grooves 15 are cut perpendicular thereto across the width of the body 40. The width w of grooves is dependent on the particular saw used, but in a specific illustration may be, for example about 20 micrometers for grooves 15 and about 100 micrometers for groove 16. The detector elements 20 formed by cutting up the body 40 in this manner may each be, for example, a square area of 100 micrometers by 100 micrometers or less. The grooves 15 and 16 formed by the saw may also, for example, cut through a continuous area of metallization 22 below the body 40 so as to define this part of the pattern of the bottom electrode connections 22. In the case where the grooves 15 and 16 are moulded already in the face 11 of the elastic substrate, the saw cuts through the body 40 can be made in alignment with these existing grooves 15 and 16. The depth d to which the grooves 15 and 16 are cut or moulded in the substrate 10 is considered in detail hereinafter with reference to FIG. 5.

The top electrode connection 21 is now provided (for example, in known manner) for the detector elements 20. Thus, the connection 21 may be formed by at least one metal conductor carried on the lower surface of a thin plastics film 25. The film 25 may be, for example, a polyimide membrane which carries heat-collector fins as described in the 1985 SPIE paper by the present inventor. Depending on the desired connections, both rows of detector elements 20 may have a common top electrode connection layer 21, or each row may have its own top electrode connection track 21. If desired, one row of detector elements 20 may form the active infrared sensing elements while the other row may be shielded from the incident radiation 30 so as to form compensating elements to provide signal compensation in known manner for the effects of temperature changes and microphony on the active elements. The periphery of the film 25 may be bonded to an apertured rigid mount 28 (the outer perimeter of which is shown in broken outline in the plan view of FIG. 2). The mount/film assembly 28 and 25 is bonded to the lower mount 18 and 19, as illustrated in FIGS. 3 and 4, using an insulating adhesive.

Because the transmission of the thermal-radiation 3 to the detector elements 20 is modulated by the chopper 1, there is a limiting distance herein termed the thermal diffusion distance D (the magnitude of which depends on the transmission frequency f) for heat flow in the substrate 10 from the detector elements 20. The concept of a thermal diffusion distance in a chopped pyroelectric infrared detector system is described in the article entitled "Calculation of Temperature Distribution and Temperature Noise in a Pyroelectric Detector—II Evacuated Tube" by R. M. Logan in Infrared Physics (1973) vol. 13, pages 91 to 98 published by Pergamon Press (Great Britain). In this Infrared Physics article (the whole contents of which are hereby incorporated herein as reference material) the concept is described in the context of lateral conduction of heat to and from a detector element area through the surrounding area of the pyroelectric layer in which the detector element is present.

In the context of the present invention, the variations in temperature of the detector elements 20 which correspond to the variations in incident thermal radiation 3 are pulsed by the chopper modulation so that the heat flow into the elastic substrate 10 from the detector elements 20 is also pulsed. Between these heat pulses the heat injected in this manner into the substrate 10 diffuses by conduction through the substrate material at a rate dependent on the thermal conductivity K and volume specific heat c of the substrate material. Due to this diffusion between heat pulses, the parts 110 of the substrate 10 which are further from the detector elements 20 than the thermal diffusion distance D (see FIG. 5) do not experience temperature variations due to the variations in temperature of the detector elements. Thus, these parts 110 of the substrate 10 beyond the distance D from the face 11 effectively act as a heat sink. An approximate expression for the thermal diffusion distance D in substrate 10 at the transmission frequency f is given by equation (1):

$$D = K^{\frac{1}{2}} \cdot (\pi cf)^{-\frac{1}{2}} \quad (1)$$

where

D is in cm.
K is in $J.cm^{-1}.K^{-1}.s^{-1}$
c is in $J.cm^{-3}.K^{-1}$
and f is in $s^{-1}$.(Hz).

In a specific example of a silicone rubber having K of about $1.5 \times 10^{-3}$ $J.cm^{-1}.K^{-1}.s^{-1}$, and c of about 1.7 $J.cm^{-3}.K^{-1}$, the value for D is about $1.67 \times 10^{-2}.(f)^{-\frac{1}{2}}$. In this specific example, D is about 26 micrometers with a chopper frequency f of 40 Hz and about 53 micrometers with f of 10 Hz.

By cutting the grooves 15 and 16 in the substrate 10 with a width w and depth d such that (2d+w) is larger than D, the temperature variations of one detector element (e.g. 20a in FIG. 5) on one platform area are not transmitted through the substrate 10 to a neighbouring detector element (e.g. 20b in FIG. 5) on a neighbouring platform area. This provides a better reduction in thermal cross-talk than the use of a thin membrane as the substrate. However, it should be noted that thermal conduction between the elements 20 in the specific detector of FIGS. 2 to 4 can still occur along the top membrane 25 carrying the top electrode connection 21.

The depth d of the grooves 15 and 16 may be less than the thermal diffusion distance D. However, it is generally preferable to cut the grooves 15 and 16 to a depth d of between 25 and 50 micrometers, or more. Thus, by making d at least as large as approximately D, thermal losses from each detector element 20 to the effective heat sink 110 are minimized by localising the extent of the heat sink of each detector element 20 to the area A in the platform pillar 111 of that detector element 20. The responsivity of the detector elements can be improved in this manner.

Having such deep grooves 15 and 16 also increases the flexibility of the pillar parts 111 of the elastic substrate 10 forming the flexible platform areas on which the detector elements 20 are mounted, and their roles (substantially independently of each other) in dampening vibrations and stress to their own detector elements is enhanced. Good acoustic decoupling between the detector elements 20 on these platform areas is obtained due to the elasticity and vibration absorption properties of the elastic material 10 over the increased acoustic path length (2d+w). The large difference in compliance between the detector element bodies 20 and the elastomer 10 results in greatly reduced stress in the detector elements from the substrate 10 during vibration. Thus, in a typical case, the Young's modulus of the elastomer may be about $10^8$ times less than that of the detector element bodies 20, for example a Young's modulus of about $8 \times 10^2$ $N.m^{-2}$ for a silicone rubber as compared with about $8 \times 10^{10}$ $N.m^{-2}$ for a lead zirconate titanate. The deep grooves 15 and 16 between the elastic pillars 111 permit the reduction in the stress at the top of the pillars, which could otherwise be transmitted from the substrate 10 to the detector elements 20.

Figure 3:
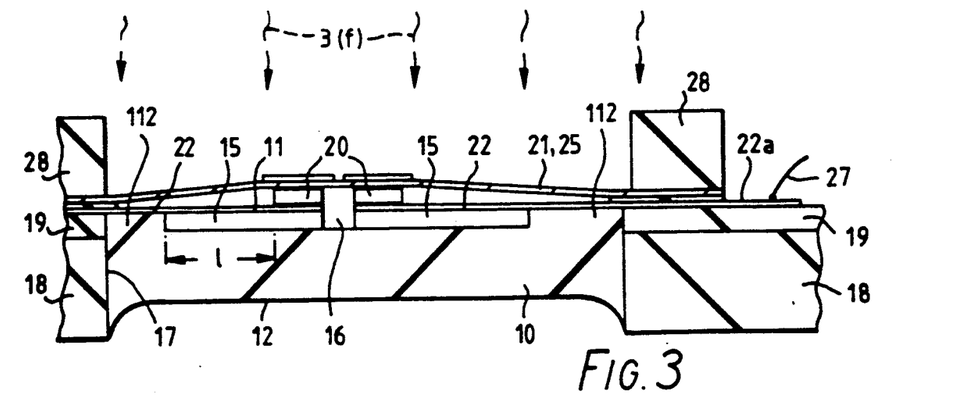
FIG. 3 is a cross sectional view of the detector of FIG. 2, taken on the line III—III.
Figure 4:
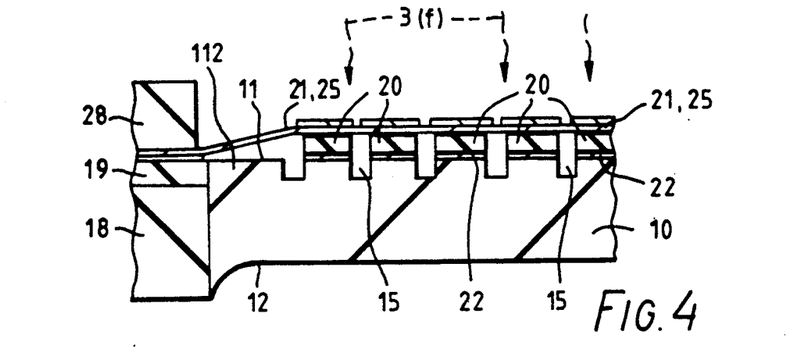
FIG. 4 is a cross-sectional view of the detector of both FIG. 2 and FIG. 7, taken on the line IV—IV.
Figure 5:
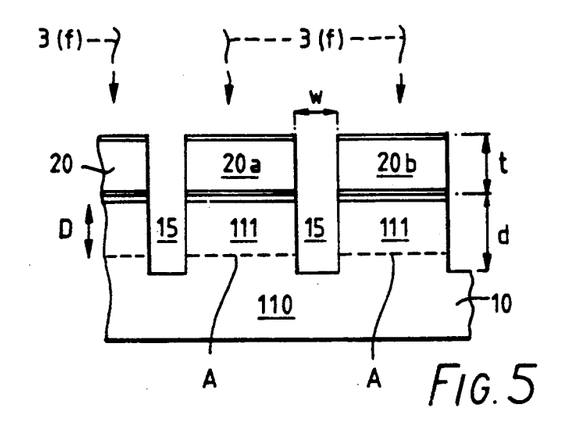
FIG. 5 is a schematic representation of two detector elements on the substrate in the cross-section of FIG. 4 and illustrating various dimensions.

As illustrated in FIGS. 2 to 4, the elastic substrate 10 comprises an ungrooved peripheral part 112 which is integral with neighbouring platform areas for detector elements 20. The lengths l of the grooves 15 and 16 from these detector elements 20 to this peripheral part 112 is larger than the thermal diffusion distance D at the frequency f so that this peripheral part 112 does not contribute to thermal cross-talk between the detector elements. However, the grooves 15 and 16 may extend longitudinally into the upper part 19 of the mount 18,19 as will be described hereinafter.

There is a slight decrease in the responsivity of the detector 2 due to the presence of the thick substrate 10. Assuming a substrate thickness at least as large as D, the fractional loss in responsivity may be represented by the approximate expression:

$$R(\%) = 100 \, tC.(k.c/4\pi f + t^2 C^2)^{-\frac{1}{2}} \quad (2)$$

where

R(%) is the responsivity of the detector as a percentage of its responsivity in the absence of any thermal conduction through the substrate 10,
t is the thickness of the detector element 20,
and C is the volume specific heat of the pyroelectric detector material.

For most detector applications a value of 90% or more would be acceptable for R(%). With a substrate 10 of silicone rubber and with a PLZT detector element 20 of 40 micrometer thickness, R(%) of at least 90% is achieved with a chopper frequency f of about 7 Hz and more. With these types of substrate 10 and detector elements 20 and with f of 40 Hz, R(%) is about 98%.

FIGS. 2 to 4 illustrate the situation in which the grooves 15 and 16 are confined to the area within the aperture 17 of the mount 18,19. In a modified form illustrated in FIG. 7 the grooves 15 and 16 (of width w and depth d) are cut so as to extend longitudinally into the upper glass part 19 of the mount 18,19. This part 19 is of a glass material which can be cut with the saw and which is of sufficient thickness to accommodate the groove depth d. In this case, the bottom electrode conductor tracks 22 can be formed by depositing a continuous conductive layer on an area of the substrate 10 and mount part 19 and by forming the grooves 15 and 16 in the substrate 10 and mount part 19 with saw cuts which divide the conductive layer into the conductor tracks 22. The tracks 22 are of the same width along their length from below the elements 20 to the bond areas for wires 27, and so the thickness and resistivity of the conductive layer is controlled to provide the desired value of electrical and thermal conductance along the tracks 22. The separation between the tracks 22 is defined by the grooves 15.

As mentioned hereinbefore, one of the rows of elements in the double row arrangement of FIGS. 2 to 4 may be compensating elements. In this case the groove 16 in the substrate 10 may be omitted so that each platform area defined by the grooves 15 may carry both an active detector element 20 of one row and a compensating element 20 of the other row (these two elements 20 still having separate pyroelectric element bodies); this may enhance microphony compensation. As described in copending United Kingdom patent application GB-A-2 217 442, instead of each detector element 20 of a linear array having its own companion compensating element 20, the linear array may have simply one or two compensating elements 20 which can be arranged in the same row as the active detector elements and the output signals of which are suitably processed and used to provide temperature compensation for the active elements 20. Thus, the device of FIGS. 2 to 4 may be modified to have only a single row of the elements 20. The whole contents of this GB-A-2 217 442 specification (published after the convention priority date of the present patent application) are hereby incorporated herein as reference material.

Figure 8:
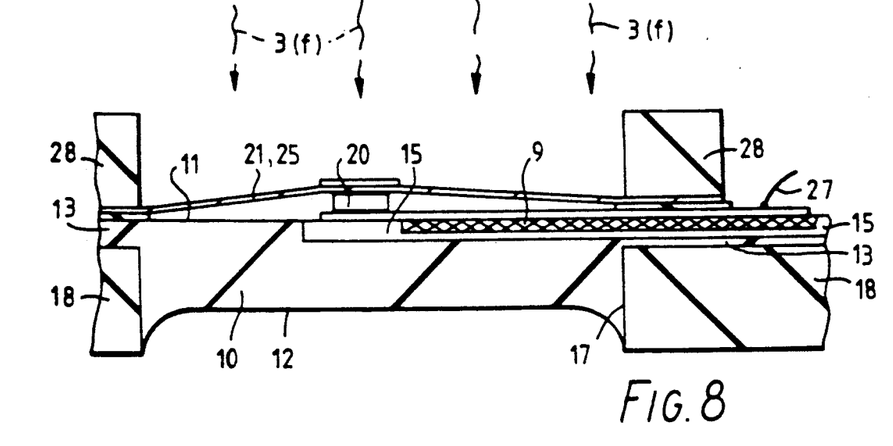

In the form illustrated in FIGS. 2 to 7, the silicone rubber 10 does not extend to any great extent on the upper surface of the mount 18,19. However, in some devices a part 13 of the silicone rubber 10 may extend several tens or even hundreds of micrometers along the upper surface of the mount 18 and may be comparatively thick (for example about 50 micrometers or more) in this area. FIG. 8 illustrates one such arrangement in which the elastic substrate 10 has a thinner glass mount 9 embedded in an area of the first face 11 of the elastic substrate 10 to one side of the detector elements 20. The conductor tracks 22 extend on the glass mount 9 and on the face 11 of the silicone rubber 10 below the detector elements 20. By way of a simple illustration, FIG. 8 shows a cross-section (similar in location to that of FIG. 3) for a detector with a single row of elements 20. A cross-section of this detector taken perpendicular to FIG. 8 may be the same in construction as that of FIG. 4 except that a silicone rubber part 13 replaces the glass part 19. Thus, the detector elements 20 and tracks 22 of the FIG. 8 device may be separated by grooves formed by parallel saw cuts 15 of width w which extend to the depth d in the silicone rubber substrate 10 and its embedded glass plate 9. Wire connections 27 can be made to the conductor tracks 22 on the glass plate 9. The edge of the plate 9 as visible in the groove 15 is double hatched in FIG. 8 for clarity of understanding, even though the cross-section of FIG. 8 is not taken through this plate 9.

In the FIG. 8 embodiment, the detector elements 20 are mounted on the metallized face 11 of the elastic substrate 10. However, it is also possible to mount the detector elements 20 on a metallized face 11 of a platform 9 of a material which in itself may be less flexible. The platform 9 may be, for example, a glass plate or a polyimide layer or a layer of a softer plastics material than polyimide, and it may overlie and be supported on an elastic substrate 10 (for example, of silicone rubber) to provide acoustic damping in the mounting arrangement for the detector elements 20. The grooves 15 (and 16) may extend into the glass plate 9 or plastics layer 9 to a depth d less than the thickness of the plate or layer 9, but preferably these grooves are cut deeper so as to extend into the underlying elastic substrate 10.

Figure 9:
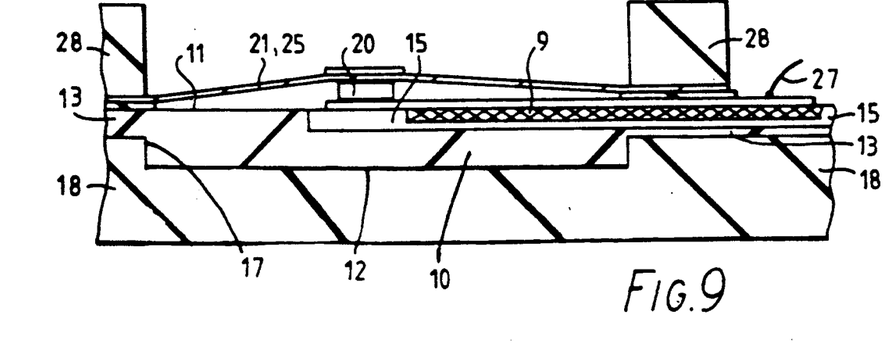

FIGS. 2 to 4 and FIGS. 6 to 8 illustrate constructions in which the second face 12 of the elastic substrate 10 is at least substantially free of contact with a rigid support over the area where the group of detector elements 20 are located. However in detectors in accordance with the invention the grooved elastic substrate 10 may be present on a rigid base (for example, a glass plate or an alumina plate) so as to restrain movement of the second face 12 of the substrate 10. One example of such a detector construction is illustrated in FIG. 9 as a modification of the FIG. 8 structure. Similar modifications are possible of the mount structure in the detectors of FIGS. 2 to 4, and FIG. 7. In each case, the rigid mount 18 extends below the part of the grooved elastic substrate 10 below the detector elements 20 and so provides a firmer support for this part of the substrate 10. In the particular form illustrated in FIG. 9, this part of the substrate 10 is partially accommodated in a surface-recess 17 in the upper surface of the rigid mount 18, and the elastic material also extends outside the recess 17. This surface recess 17 strengthens the bonding of the elastomer substrate 10 to the mount 18. In the modifications of FIGS. 2 to 4 and FIG. 7, the elastic material 10 may be wholly accommodated in a surface recess 17. However, in other detector constructions in accordance with the invention, the upper surface of the mount 18 may be substantially flat. Instead of being simply a mounting plate, the rigid mount 18 may be, for example a plinth, base or header part of an envelope of the detector, or even for example a circuit board.

Although the embodiments described so far are for a linear array of detector elements 20, the present invention may also be employed for two-dimensional arrays. A system in accordance with the invention may comprise a thermal-image sensing device as described in published European patent application EP-A-0 284 131 (our reference PHB33345) but modified with an elastic grooved polymer material in accordance with the invention covering the circuit base. Thus in a modified form of FIG. 6 of EP-A-0 284 131, the semiconductor circuit 1 may be covered with a sufficient thickness of silicone rubber to form the layer 10 on which the detector elements are mounted. The detector elements have bottom electrode connections formed as metallized bores in the silicone rubber covering 10. In this new modification of FIG. 6 of EP-A-0 284 131, the thickness of the layer 10 and the depth and width of the grooves 36 cut into the layer 10 are chosen in accordance with the present invention. The whole contents of EP-A-0 284 131 are hereby incorporated herein as reference material. However, in the case of a 2-dimensional array with a detector element thickness t of about 10 micrometers the responsivity is significantly reduced, for example R(%) of about 80% with f of 40 Hz. This loss in responsivity can be improved by increasing the diameter of the bore, and/or by using a higher chopping frequency f and integrating the output signals from the detector elements in a manner similar to that described in U.S. Pat. No. 4 072 863 (the whole contents of which are hereby incorporated herein as reference material).

Many other modifications and variations are possible within the scope of the present invention. In most applications of the invention, the material of the body 40 and the design and circuitoperation of the detector elements 20 are likely to be chosen so as to utilize the conventional pyroelectric effect in which when a temperature change occurs (for example upon absorption of incident infrared radiation 3 of a thermal image) in a polar crystalline material exhibiting spontaneous polarization, the crystalline material generates electric charges at its opposite faces. By arranging the pyroelectric crystalline material in known manner as a capacitor (with electrode connections 21 and 22 at the opposite faces) in a suitable amplifying circuit, a current or voltage signal can be developed and detected. Most of the useful pyroelectric materials are also ferroelectric and exhibit their pyroelectric properties in the ferroelectric phase below their Curie point transition temperature. However, infrared detectors may also be constructed in known manner using ferroelectric materials operating in the region of their Curie point where their dielectric constant changes rapidly with temperature. Such ferroelectric infrared detector elements may also be constructed as capacitors with electrode connections 21 and 22 at opposite faces. Both these pyroelectric and ferroelectric types of detector elements 20 can be manufactured in groups on an elastic substrate 10 in accordance with the present invention and both benefit in similar ways from the flexible support and acoustic decoupling provided by the grooved silicone rubber 10 on which they (and their bottom electrode connections 22) are supported, and from the good thermal isolation resulting from the substrate grooves and the low thermal conductivity of the elastic substrate material.

From reading the present disclosure, other variations will be apparent to persons skilled in the art. Such variations may involve equivalents and other features which are already known in the design, manufacture and use of elastic materials, and of thermal-radiation detection systems and devices, groups of infrared detector elements of ferroelectric and/or pyroelectric material, and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A thermal-radiation detector comprising a group of infrared detector elements of ferroelectric and/or pyroelectric material the temperatures of which change in response to incident thermal-radiation, and a flexible substrate of electrically and thermally insulating polymer material having first and second opposite faces on the first of which the detector elements are mounted, characterised in that the substrate comprises elastic material into which grooves extend from the first face of the substrate so as to form a group of flexible platform areas on each of which a respective detector element is mounted.

2. A detector as claimed in claim 1, further characterised in that the elastic polymer material is a silicone rubber.

3. A detector as claimed in claim 1 or claim 2, further characterised in that the elastic material is suspended in at least one aperture of a rigid mount.

4. A detector as claimed in claim 1 or claim 2, further characterised in that the elastic material is supported on top of a rigid mount, and in that the mount has a surface-recess below where the detector elements are mounted.

5. A detector as claimed in claim 3 or claim 4, further characterised in that the elastic material also extends onto an upper surface of the rigid mount around the aperture or surface-recess.

6. A detector as claimed in claim 1, further characterised in that the elastic substrate has a thinner glass mount embedded in an area of the first face to one side of the detector elements, and in that a pattern of conductive tracks extends on the glass mount and on the first face of the elastic substrate below the detector elements to form bottom electrode connections to the detector elements.

7. A detector as claimed in claim 3, further characterised in that a pattern of conductive tracks extends on the first face of the elastic substrate from the detector elements to the mount, each track extending below a respective detector element to form a bottom electrode connection to that detector element.

8. A detector as claimed in claim 6, further characterised in that at least some of the grooves in the elastic substrate extend longitudinally into the mount, and in that the separation between the conductor tracks is defined by the grooves in the substrate and mount.

9. A detector as claimed in claim 1, further characterised in that the grooves in the elastic substrate are moulded in the first face of the elastic material.

10. A detector as claimed in claim 1, further characterised in that the detector elements are separated by grooves which are in alignment with the grooves in the substrate.

11. A thermal-radiation detection system comprising a detector as claimed in claim 1, and modulation means in front of the detector elements for periodically modulating the transmission of the thermal-radiation to the detector elements thereby determining a transmission frequency for the incidence of the thermal-radiation on the detector elements, the grooves in the substrate having a sufficient depth d and width w that the distance $(2d+w)$ is at least as large as the thermal diffusion distance for heat flow in the substrate from the detector elements at the transmission frequency for the incidence of the thermal-radiation on the detector elements.

12. A thermal-radiation detection system comprising a group of infrared detector elements of ferroelectric and/or pyroelectric material the temperatures of which change in response to incident thermal-radiation, a substrate of electrically and thermally insulating material having first and second opposite faces on the first of which the detector elements are mounted, and modulation means in front of the detector elements for periodically modulating the transmission of the thermal-radiation to the detector elements thereby determining a transmission frequency for the incidence of the thermal-radiation on the detector elements, characterized in that the first face of the substrate is divided by grooves of width w and depth d into a group of platform areas corresponding to the group of detector elements whereby each detector element is mounted on a respective platform area of the substrate, in that the grooves are sufficiently deep and wide that the distance $(2d+w)$ is at least as large as the thermal diffusion distance for heat flow in the substrate from the detector elements at the transmission frequency for the incidence of the thermal-radiation on the detector elements.

13. A detection system as claimed in claim 12, further characterised in that the depth d of the grooves is at least as large as approximately said thermal diffusion distance at said transmission frequency.

14. A detection system as claimed in claim 12, further characterised in that the substrate comprises a peripheral part which is integral with neighbouring platform areas for detector elements of the group, and in that the length of the grooves from these detector elements to the peripheral part of the substrate is at least as large as approximately said thermal diffusion distance at said transmission frequency.

* * * * *